(12) United States Patent
Jansen

(10) Patent No.: US 7,439,919 B2
(45) Date of Patent: Oct. 21, 2008

(54) MULTILAYER PCB ANTENNA

(75) Inventor: Stefan Jansen, København SV (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/428,081

(22) Filed: Jun. 30, 2006

(65) Prior Publication Data

US 2006/0238420 A1    Oct. 26, 2006

Related U.S. Application Data

(63) Continuation of application No. 10/084,981, filed on Mar. 1, 2002.

(30) Foreign Application Priority Data

| Mar. 2, 2001 | (GB) | ................................. | 0105251.3 |
| Mar. 5, 2001 | (GB) | ................................. | 0105413.9 |

(51) Int. Cl.
 *H01Q 1/38* (2006.01)
(52) U.S. Cl. ................. 343/702; 343/700 MS
(58) Field of Classification Search .......... 343/700 MS, 343/702, 741, 742
See application file for complete search history.

(56) References Cited

U.S. PATENT DOCUMENTS

| 2,501,430 | A | * | 3/1950 | Alford ......................... 343/741 |
| 4,860,019 | A |   | 8/1989 | Jiang |
| 4,873,529 | A |   | 10/1989 | Gibson |
| 4,994,820 | A |   | 2/1991 | Suzuki et al. |
| 5,319,378 | A |   | 6/1994 | Nalbandian |
| 5,668,559 | A |   | 9/1997 | Baro |
| 5,828,340 | A |   | 10/1998 | Johnson |
| 5,859,614 | A |   | 1/1999 | Paolella |
| 5,870,065 | A |   | 2/1999 | Kanba et al. |
| 5,898,404 | A |   | 4/1999 | Jou |
| 6,052,093 | A |   | 4/2000 | Yao et al. |
| 6,057,803 | A | * | 5/2000 | Kane et al. .................. 343/713 |

(Continued)

FOREIGN PATENT DOCUMENTS

DE           29701589 U1      4/1997

(Continued)

OTHER PUBLICATIONS

L.B. Cebik, "Modeling and Understanding Small Beams", Pat 5: The ZL Special, pp. 1-15, Mar. 31, 2004 (http://www.cebik.com/mu/mu5a.html).

(Continued)

*Primary Examiner*—Michael C. Wimer
(74) *Attorney, Agent, or Firm*—Scott E. Kamholz; Foley Hoag LLP

(57) ABSTRACT

An inverted F-antenna may include an element formed from conductor patterns on a plurality of layers including at least one buried layer of a multilayer PCB, wherein (a) the conductor patterns are in stacked relation and interconnected through the PCB, (b) the conductor patterns comprise an F-shaped conductor pattern on one layer of the PCB and an I-, L- or F-shaped conductor pattern on the or each other layer, and (c) the or each I-, L- or F-shaped conductor pattern comprises an upright substantially coextensive with an upright of the F-shaped conductor pattern. A mobile phone may include such an antenna.

35 Claims, 3 Drawing Sheets

U.S. PATENT DOCUMENTS

| | | | |
|---|---|---|---|
| 6,075,485 | A | 6/2000 | Lilly et al. |
| 6,107,970 | A | 8/2000 | Holshouser |
| 6,166,694 | A * | 12/2000 | Ying .................. 343/702 |
| 6,204,814 | B1 | 3/2001 | Rothe |
| 6,215,455 | B1 | 4/2001 | D'Angelo |
| 6,348,892 | B1 | 2/2002 | Annamaa |
| 6,377,227 | B1 | 4/2002 | Zhu |
| 6,424,317 | B2 | 7/2002 | Rudish |
| 6,501,425 | B1 | 12/2002 | Nagumo |
| 6,542,050 | B1 | 4/2003 | Arai |
| 6,759,984 | B2 | 7/2004 | Wielsma |
| 6,940,456 | B2 | 9/2005 | Wielsma |
| 6,977,626 | B2 | 12/2005 | Wielsma |
| 6,982,671 | B2 | 1/2006 | Killen |
| 6,992,637 | B2 | 1/2006 | Hwang |
| 2005/0179600 | A1 | 8/2005 | Wielsma |

FOREIGN PATENT DOCUMENTS

| | | |
|---|---|---|
| EP | 0390600 A2 | 10/1990 |
| EP | 0 547 563 A1 | 6/1993 |
| EP | 0 762 539 | 8/1996 |
| EP | 0 757 405 A | 2/1997 |
| EP | 0 986 130 A2 | 3/2000 |
| GB | 2237451 A | 5/1991 |
| JP | 57-202102 A | 12/1982 |

OTHER PUBLICATIONS

Robert E. Collin, Case Western Reserve University, "Antennas and Radiowave Propagation", pp. 107-149, McGraw-Hill Book Company, New York etc., no date.

VE3GK Gerry King, "Antenna Element Traps" Mar. 31, 2004 (http://www.ve3gk.com/eltraps.htm, pp. 1-3; and Electric Antenna Element for XM Satellite radio/DAV223CLIT (http://www.toko.co.jp/products/new/antenna/dav2338cltt_e.htm (1 pg.); and Multi-tuned Active/Passive Antenna Element Characterization, by David Thompson, 2003 NASA Academy (8 pgs.).

Jimmy Ho, BEng(Hons), MEngSc senior Development Engineer—CSA Wireless, "Wideband Antenna Element" appearing in CSA Wireless, pp. 1-3 and A. B. Smolders et al, Netherlands Foundation for Research in Astronomy, Wide-Band Antenna Element with Integrated Balun, (4 pgs.) presented at the IEEE APS Int. Symposium Atlanta USA 1998.

R. S. Hewes, et al, Radio Data Reference Book, Part 5, pp. 130-133, Radio Society of Great Britain, no date.

Soras, C. et al: "Analysis and Design of an 8 Inverted-F Antenna Printed on a PCMCIA Card for the 2.4 GHz ISM Band", IEEE Antennas and Propatation Magazine, IEEE Inc., New York, US, vol. 44, No. 1, Feb. 2002, pp. 37-44, XP001101586 ISSN: 1045-9243.

Bhartia, P. et al., *Millimeter-Wave Microstrip and Printed Circuit Antennas*, (Artech House, Inc., 1991), Chapter 3: Materials and Substrate Selection, pp. 47-55.

Lee, K. F. et al., *Advances in Microstrip and Printed Antennas*, (John Wiley & Sons, Inc., Lee, K.F. et al., eds, 1997), Chapter One: Probe-Fed Microstrip Antennas, pp. 1-4, 20 and 36.

Huang, J. et al., *Advances in Microstrip and Printed Antenna*, (John Wiley & Sons, Inc., Lee, K.F. et al., eds, 1997), Chapter Three: Microstrip Arrays: Analysis, Design, and Applications, pp. 123 and 124.

James, J. R. et al., *Advances in Microstrip and Printed Antennas*, (John Wiley & Sons, Inc. Lee, K.F. et al., eds, 1997), Chapter Six: Multification Printed Antennas, pp. 273-277 and 294-296.

* cited by examiner

MULTILAYER PCB ANTENNA

CROSS-REFERENCE TO RELATED APPLICATION

This application is a continuation of U.S. application Ser. No. 10/084,981, filed Mar. 1, 2002, which is hereby incorporated herein by reference, and which claims the right of priority of GB Application No. GB0105251.3, filed Mar. 2, 2001, and of GB Application No. GB0105413.9, filed Mar. 5, 2001.

FIELD

The present invention relates to PCB antennas.

BACKGROUND

Bluetooth is a short range wireless networking system operating in the ISM 2.4 GHz band. The development of Bluetooth has required designers of disparate electronic devices to include rf circuitry for the first time and, in the case of mobile phones, additional rf circuitry. This of course can lead to undesirable increases in the size of devices to accommodate the electronics and the antenna or antennas required.

PCB antennas are disclosed in DE-U-29701 589, GB-A-2237451 and U.S. Pat. No. 5,898,404. However, in each of these documents the elements are formed from single layers of conductor.

SUMMARY

An antenna according to the present invention is characterized in that the element is formed from conductor patterns on a plurality of layers of a multilayer PCB, wherein the conductor patterns are in stacked relation and interconnected through the PCB.

The term "element" is not used herein as a generic reference to any structure but is used with the sense normally given in the field of antennas, for example in phrases such as "2-element Yagi" and "parasitic element."

Preferably, the element is located at the edge of the PCB. This reduces the amount of lossy PCB material in the vicinity of the antenna. Additionally or alternatively, the PCB may be apertured adjacent to the element. This also reduces the amount of lossy PCB material in the vicinity of the antenna.

The present invention may be embodied in an inverted-F antenna comprising an F-shaped conductor pattern on a first layer of the PCB and an I-, L- or F-shaped conductor pattern on the or each other layer, wherein the or each I-shaped conductor pattern is substantially coextensive with the "upright" of the F-shaped conductor pattern.

Preferably, the or each I-, L- or F-shaped conductor pattern extends along the edge of the PCB.

Preferably, the PCB is apertured, for example, by means of a slot, between the "upright" of the F-shaped conductor pattern and a ground plane area.

An antenna ground plane may be provided by a plurality of vias connecting ground plane regions on respective PCB layers.

An antenna according to the present invention may be employed in a mobile phone.

DETAILED DESCRIPTION

An embodiment of the present invention will now be described, by way of example, with reference the accompanying drawings.

Figure 1:
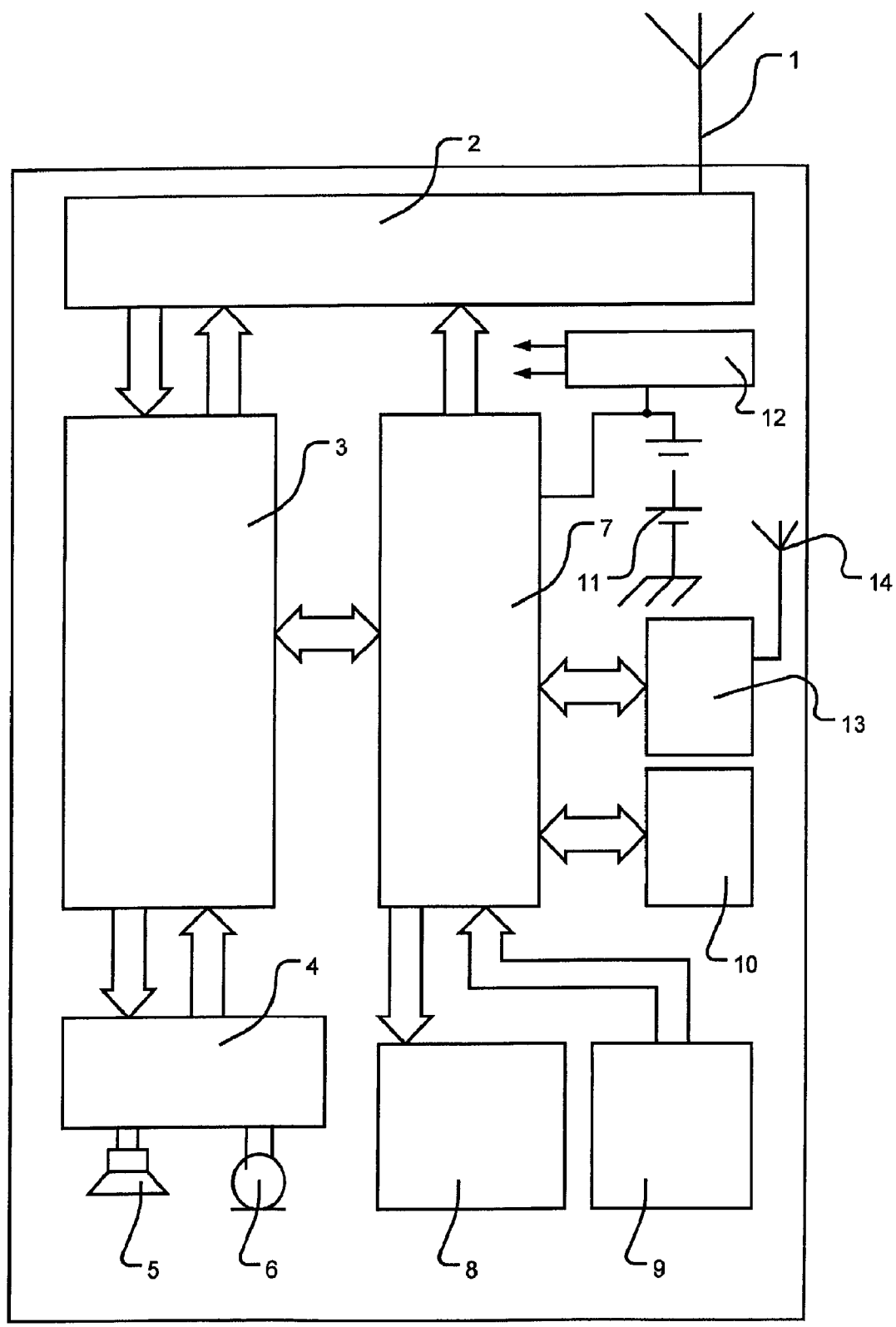
FIG. 1 is a block diagram of a mobile phone including an antenna according to the present invention.

Referring to FIG. 1, a mobile telephone comprises an antenna 1, an rf subsystem 2, a baseband DSP (digital signal processing) subsystem 3, an analog audio subsystem 4, a loudspeaker 5, a microphone 6, a controller 7, a liquid crystal display 8, a keypad 9, memory 10, a battery 11, a power supply circuit 12, a Bluetooth transceiver 13 and a Bluetooth antenna 14.

The rf subsystem 2 contains if and rf circuits of the mobile telephone's transmitter and receiver and a frequency synthesizer for tuning the mobile telephone's transmitter and receiver. The antenna 1 is coupled to the rf subsystem 2 for the reception and transmission of radio waves.

The baseband DSP subsystem 3 is coupled to the rf subsystem 2 to receive baseband signals therefrom and for sending baseband modulation signals thereto. The baseband DSP subsystems 3 includes codec functions which are well-known in the art.

The analog audio subsystem 4 is coupled to the baseband DSP subsystem 3 and receives demodulated audio therefrom. The analog audio subsystem 4 amplifies the demodulated audio and applies it to the loudspeaker 5. Acoustic signals, detected by the microphone 6, are pre-amplified by the analog audio subsystem 4 and sent to the baseband DSP subsystem 4 for coding.

The controller 7 controls the operation of the mobile telephone. It is coupled to the rf subsystem 2 for supplying tuning instructions to the frequency synthesizer and to the baseband DSP subsystem for supplying control data and management data for transmission. The controller 7 operates according to a program stored in the memory 10. The memory 10 is shown separately from the controller 7. However, it may be integrated with the controller 7. A timer for triggering interrupts is also provided by the controller 7.

The display device 8 is connected to the controller 7 for receiving control data and the keypad 9 is connected to the controller 7 for supplying user input data signals thereto. Amongst other functions, the display device displays the estimated extant life of the battery 11.

The battery 11 is connected to the power supply circuit 12 which provides regulated power at the various voltages used by the components of the mobile telephone. The positive terminal of the battery 11 is connected to an analog-to-digital converter (ADC) input of the controller 7.

The Bluetooth transceiver 13 is controlled by the controller 7 and sends and receives signals via the Bluetooth antenna 14.

Figure 2:
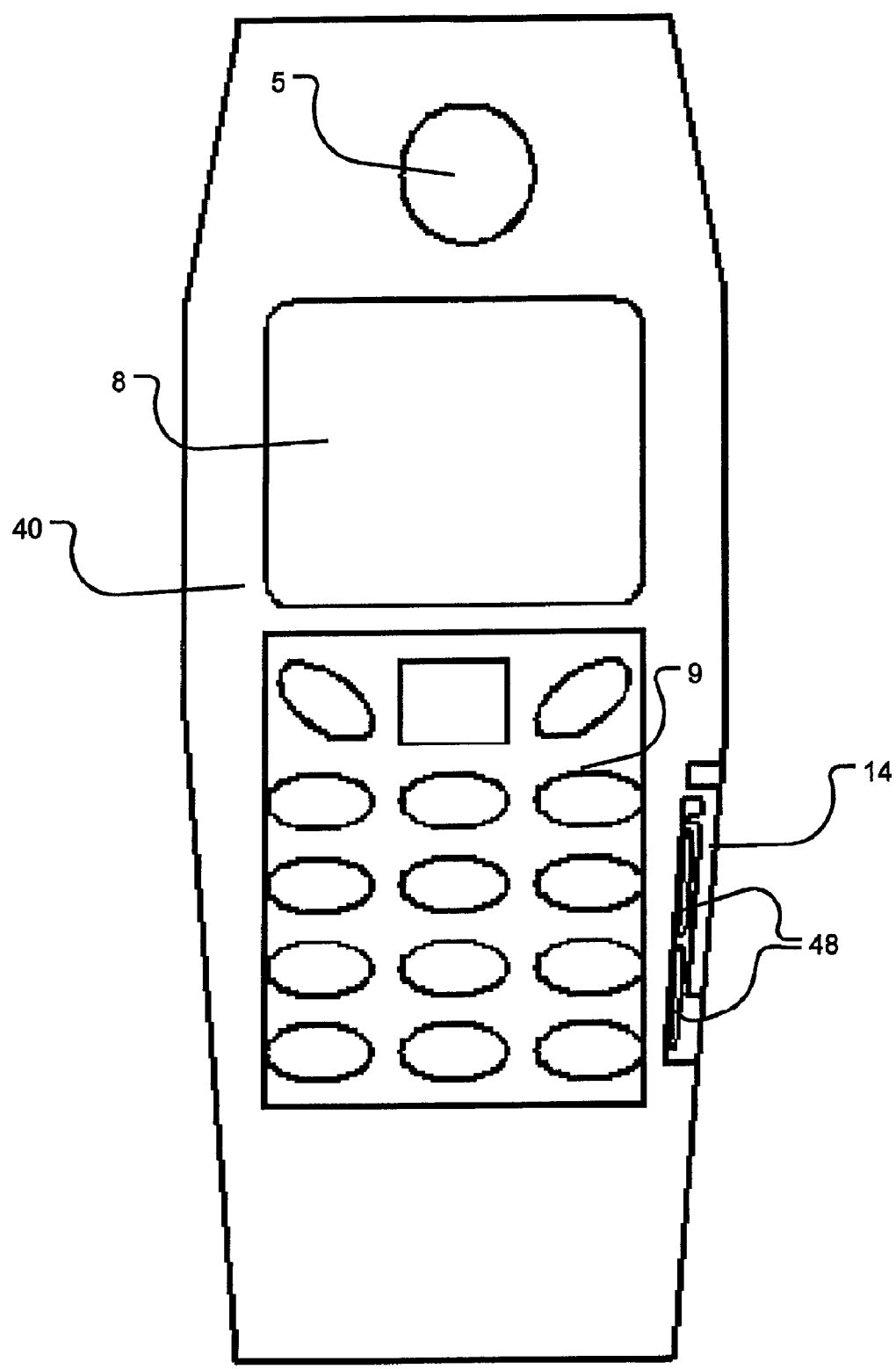
FIG. 2 illustrates the arrangement of an antenna according to the present invention on the main PCB of the mobile phone of FIG. 1.

Referring to FIG. 2, the PCB 40 of the mobile phone has an upper end on which the loudspeaker 5 is mounted. The display 8 is mounted below the loudspeaker 5 and below the display is the keypad 9. The Bluetooth antenna 14 comprises an inverted-F antenna formed in a small strip-shaped region to the side of the keypad 9.

Figure 3:
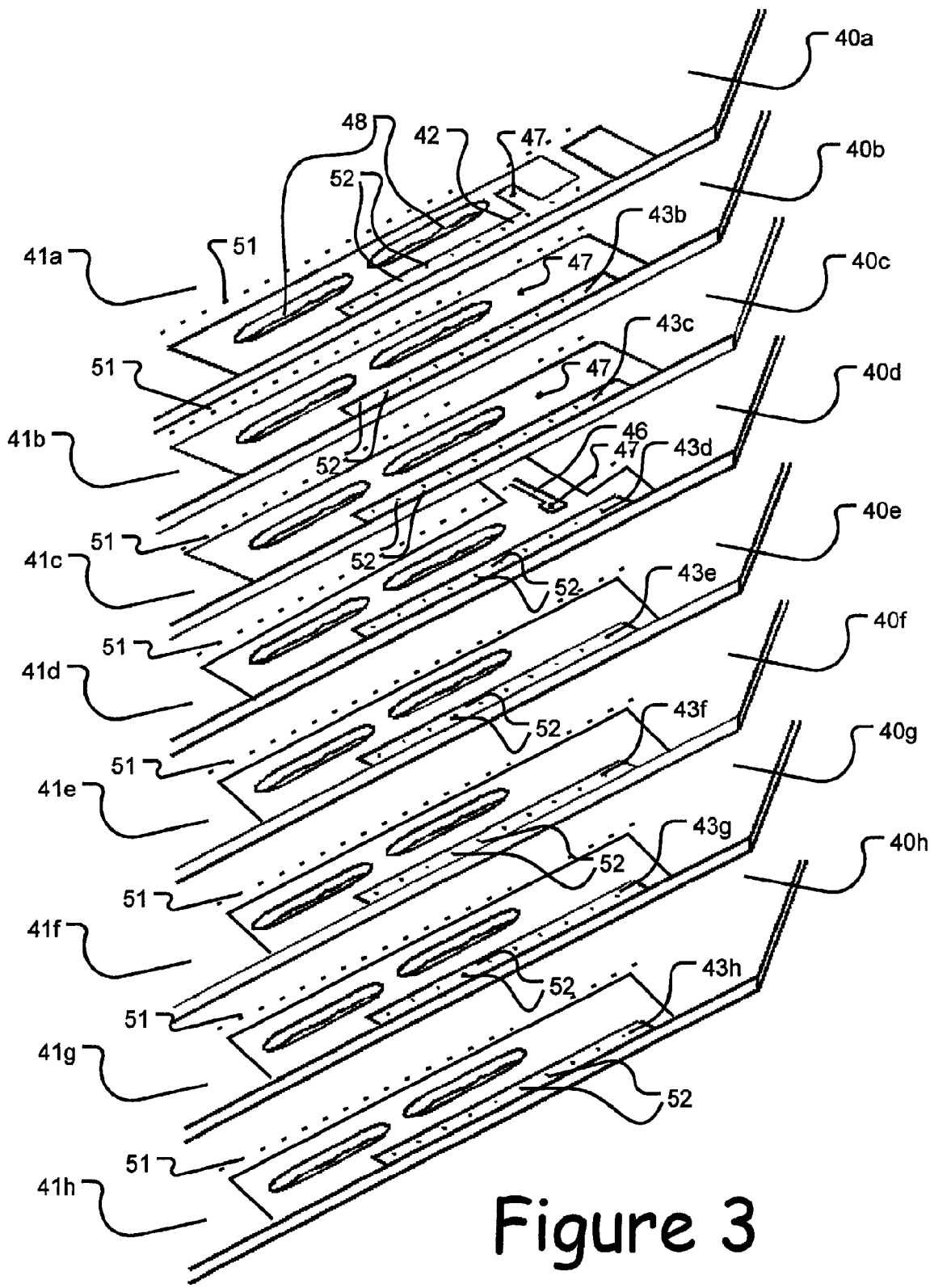
FIG. 3 is an exploded view of the antenna of FIG. 2.

Referring also to FIG. 3, the PCB 40 has first to eighth layers 40a, ..., 40h (shown with exaggerated thickness). The layers 40a, ..., 40h have respective ground plane areas 41a, ..., 41h. The ground planes 41a, ..., 41h are partially removed at the edges of the layers 40a, ..., 40h. However, an F-shaped region 42 of conductor is left on the first layer 40a.

The "upright" of the F-shaped region 42 runs along the very edge of the first layer 40a with the "arms" directed inwards towards the ground plane 41a. Only the upper "arm" actually joins the ground plane 41a.

On the second to eighth layers 40b, . . . , 40h, an I-shaped region 43b, . . . , 43h of conductor is left along the edge under the "upright" of the F-shaped region 42 and coextensive therewith. The eighth layer 40h may be double sided and also have an I-shaped region on its other side.

The fourth layer 40d includes the feed 46 to the antenna which extends to a point under the shorter "arm" of the F-shaped region 42.

The "upright" of the F-shaped region 42 and the I-shaped regions 43b, . . . , 43h are connected by a plurality of vias 52. This unites these regions which collectively form the radiating element of the Bluetooth antenna 14. Similarly, the feed 46 is connected to the shorter "arm" of the F-shaped region 42 by a via 47. A row of vias 51 unites the edges of the ground plane areas 41a, . . . , 41h, which are substantially parallel to the "upright" of the F-shaped region 42, to form a ground plane for the antenna.

In order to reduce losses, two slots 48 are cut through the full thickness of the PCB 40. The slots 48 are located so that they are between the "upright" of the F-shaped region 42 and the ground plane on the first layer 40a, and extend parallel to the "upright" of the F-shaped region 42.

It will be appreciated that many modifications may be made to the above-described embodiment. For example, the I-shaped regions could be replaced with L-shaped regions which match the "upright" and upper arm parts of the F-shaped region or further F-shaped regions.

The antenna may be formed using other multilayer PCB structures, for instance three double-sided PCB layers (i.e. copper on both faces) may form the second to seventh layers of the antenna with single-sided PCB being used to form the first and eighth antenna layers.

Other forms of antenna, for example resonant dipoles, can be formed in a similar manner. Furthermore, multi-element antennas may be formed if directivity is a desirable characteristic. Additionally, a plurality of antennas by be formed on the same PCB or in the same way on different PCBs to provide path diversity, directivity or omnidirectivity as desired.

The invention claimed is:

1. An inverted F-antenna comprising:
   an element, and wherein
   the element is formed from conductor patterns on a plurality of layers including at least one buried layer of a multilayer PCB, the PCB is apertured adjacent to the element, the conductor patterns are in stacked relation and interconnected through the PCB, and the conductor patterns comprise an F-shaped conductor pattern on one layer of the PCB and an I-, L- or F-shaped conductor pattern on the or each other layer, wherein the or each I-, L- or F-shaped conductor pattern comprises an upright substantially coextensive with an upright of the F-shaped conductor pattern.

2. An antenna according to claim 1, wherein the element is located at an edge of the PCB.

3. An antenna according to claim 1, wherein the or each I-, L- or F-shaped conductor pattern extends along an edge of the PCB.

4. An antenna according to claim 3, wherein the PCB is apertured between the upright of at least one F-shaped conductor pattern and a ground plane area.

5. An antenna according to claim 4, wherein the PCB has a slot between the upright of the at least one F-shaped conductor pattern and a ground plane area.

6. An antenna according to claim 1, including an antenna ground plane comprising a plurality of vias connecting ground plane regions on respective PCB layers.

7. An antenna according to claim 6, wherein the conductor patterns are elongated and each longitudinally extends at an edge of the PCB.

8. An antenna in accordance with claim 1, wherein interconnection of the conductor patterns is from the conductor patterns through the at least one buried layer.

9. An antenna in accordance with claim 8, wherein the interconnection is by vias extending through the at least one buried layer of the PCB.

10. An antenna according to claim 1, wherein the PCB is apertured in a dielectric layer.

11. A mobile communications device including an inverted F-antenna disposed therein, the antenna comprising an element formed from conductor patterns on a plurality of layers including at least one buried layer of a multilayer PCB, wherein the PCB is apertured adjacent to the element, and wherein the conductor patterns are in stacked relation and interconnected through the PCB, and comprise an F-shaped conductor pattern on one layer of the PCB and an I-, L- or F-shaped conductor pattern on the or each other layer, wherein the or each I-, L- or F-shaped conductor pattern comprises an upright substantially coextensive with the upright of the F-shaped conductor pattern.

12. A mobile communications device according to claim 11, wherein the conductor patterns are elongated and each longitudinally extends at an edge of the PCB.

13. A mobile communications device according to claim 11, wherein the or each I-, L- or F-shaped conductor pattern extends along an edge of the PCB.

14. A mobile communications device according to claim 13, wherein the PCB is apertured between the upright of at least one F-shaped conductor pattern and a ground plane area.

15. A mobile communications device according to claim 14, wherein the PCB has a slot between the upright of the at least one F-shaped conductor pattern and a ground plane area.

16. A mobile communications device according to claim 11, including an antenna ground plane comprising a plurality of vias connecting ground plane regions on respective PCB layers.

17. A mobile communications device in accordance with claim 11, wherein interconnection of the conductor patterns is from the conductor patterns through the at least one buried layer.

18. A mobile communications device in accordance with claim 17, wherein the interconnection is by vias extending through the at least one buried layer of the PCB.

19. A mobile communications device in accordance with claim 11, wherein the mobile communications device is a mobile phone.

20. A mobile phone in accordance with claim 19, wherein the conductor patterns are elongated and each longitudinally extends at an edge of the PCB.

21. A mobile phone in accordance with claim 19, wherein the or each I-, L- or F-shaped conductor pattern extends along an edge of the PCB.

22. A mobile phone in accordance with claim 21, wherein the PCB is apertured between the upright of at least one F-shaped conductor pattern and a ground plane area.

23. A mobile phone in accordance with claim 22, wherein the PCB has a slot between the upright of the at least one F-shaped conductor pattern and a ground plane area.

24. A mobile phone in accordance with claim 19, including an antenna ground plane comprising a plurality of vias connecting ground plane regions on respective PCB layers.

25. A mobile phone in accordance with claim 19, wherein interconnection of the conductor patterns is from the conductor patterns through the at least one buried layer.

26. A mobile phone in accordance with claim 25, wherein the interconnection is by vias extending through the at least one buried layer of the PCB.

27. A mobile phone according to claim 11, wherein the PCB is apertured in a dielectric layer.

28. An inverted F-antenna comprising:

an element, wherein the element is formed from conductor patterns on a plurality of layers including at least one buried layer of a multilayer PCB, the conductor patterns are in stacked relation and interconnected through the PCB, and the conductor patterns comprise an F-shaped conductor pattern on one layer of the PCB and an I-, L- or F-shaped conductor pattern on the or each other layer, wherein the or each I-, L- or F-shaped conductor pattern comprises an upright substantially coextensive with an upright of the F-shaped conductor pattern; and an antenna ground plane comprising a plurality of vias connecting ground plane regions on respective PCB layers.

29. An antenna according to claim 28, wherein the element is located at an edge of the PCB.

30. An antenna according to claim 28, wherein the or each I-, L- or F-shaped conductor pattern extends along an edge of the PCB.

31. An antenna according to claim 30, wherein the PCB is apertured between the upright of at least one F-shaped conductor pattern and a ground plane area.

32. An antenna according to claim 31, wherein the PCB has a slot between the upright of the at least one F-shaped conductor pattern and a ground plane area.

33. An antenna according to claim 28, wherein the conductor patterns are elongated and each longitudinally extends at an edge of the PCB.

34. An antenna in accordance with claim 28, wherein interconnection of the conductor patterns is from the conductor patterns through the at least one buried layer.

35. An antenna in accordance with claim 34, wherein the interconnection is by vias extending through the at least one buried layer of the PCB.

* * * * *